(12) United States Patent
Azuma et al.

(10) Patent No.: US 10,622,781 B2
(45) Date of Patent: Apr. 14, 2020

(54) WAVELENGTH MONITORING DEVICE, LIGHT SOURCE DEVICE, AND OPTICAL MODULE

(71) Applicant: Fujitsu Optical Components Limited, Kawasaki-shi, Kanagawa (JP)

(72) Inventors: Tomonori Azuma, Ota (JP); Kohei Shibata, Isehara (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 82 days.

(21) Appl. No.: 15/935,886

(22) Filed: Mar. 26, 2018

(65) Prior Publication Data

US 2018/0316154 A1 Nov. 1, 2018

(30) Foreign Application Priority Data

Apr. 28, 2017 (JP) .................................. 2017-089908

(51) Int. Cl.
| | | |
|---|---|---|
| *H01S 3/13* | (2006.01) | |
| *G02B 17/00* | (2006.01) | |
| *G02B 27/28* | (2006.01) | |
| *H01S 3/04* | (2006.01) | |

(Continued)

(52) U.S. Cl.
CPC .......... *H01S 3/1305* (2013.01); *G01J 3/0256* (2013.01); *G02B 5/284* (2013.01); *G02B 5/3083* (2013.01);
(Continued)

(58) Field of Classification Search
CPC ........ H01S 3/1305; H01S 3/13; H01S 3/0405; H01S 3/0401; H01S 5/0687;
(Continued)

(56) References Cited

U.S. PATENT DOCUMENTS 3,719,414 A * 3/1973 Wentz .................. G02F 1/0311
359/247
5,107,512 A * 4/1992 Shibutani .............. H01S 5/0687
372/105
(Continued)

FOREIGN PATENT DOCUMENTS

| | | |
|---|---|---|
| JP | 2003-324241 | 11/2003 |
| JP | 2005-85904 | 3/2005 |
| JP | 2013-29549 | 2/2013 |

OTHER PUBLICATIONS

Chinese First Notification of Office Action dated Jan. 19, 2020 in corresponding Chinese Patent Application No. 201810372011.0 (Total 19 pages).

*Primary Examiner* — John R Lee

(57) ABSTRACT

A wavelength monitoring device includes a polarization rotation element; an etalon element that includes a first double refractive layer and a single refractive layer or a second double refractive layer that is disposed by rotating an optic axis of the second double refractive layer with respect to an optic axis of the first double refractive layer; a polarization separating element that separates an input light, which has the polarization direction rotated and is transmitted through the etalon element, into first light having a polarization direction parallel to the optic axis of the first double refractive layer and second light having a polarization direction perpendicular to the optic axis of the first double refractive layer; a first light receiving device that receives the first light to detect a first monitor value; and a second light receiving device that receives the second light to detect a second monitor value.

14 Claims, 6 Drawing Sheets

(51) Int. Cl.
 G01J 3/02 (2006.01)
 H01S 5/0687 (2006.01)
 G02B 5/30 (2006.01)
 G02B 5/28 (2006.01)
(52) U.S. Cl.
 CPC ......... G02B 17/004 (2013.01); G02B 27/283 (2013.01); G02B 27/286 (2013.01); H01S 3/0405 (2013.01); H01S 5/0687 (2013.01)
(58) Field of Classification Search
 CPC ..... H01S 5/0683; H01S 5/068; G02B 17/004; G02B 27/283; G02B 27/28; G02B 27/286; G02B 27/288; G02B 5/284; G02B 5/28; G02B 5/3083; G02B 5/30; G01J 3/0256
 See application file for complete search history.

(56) References Cited

U.S. PATENT DOCUMENTS

| | | | | |
|---|---|---|---|---|
| 6,483,956 B1* | 11/2002 | Shevy | ................... | H01S 3/1303 372/20 |
| 6,567,437 B1* | 5/2003 | Imaki | ....................... | G01J 9/00 372/32 |
| 7,301,974 B2* | 11/2007 | Imaki | ....................... | G01J 4/04 356/365 |
| 8,054,466 B1* | 11/2011 | Flanders | ............... | G01J 3/0218 356/451 |
| 8,514,685 B2* | 8/2013 | Sirat | ....................... | G02B 1/02 359/364 |
| 2003/0076564 A1* | 4/2003 | Furuichi | ............. | H01S 5/02252 398/129 |
| 2003/0161567 A1* | 8/2003 | Baxter | ............... | G02B 6/29358 385/11 |
| 2004/0100686 A1* | 5/2004 | Flanders | ............ | H01S 5/02216 359/341.1 |
| 2005/0051712 A1 | 3/2005 | Komiyama | | |
| 2006/0256437 A1* | 11/2006 | Imaki | ....................... | G01J 9/02 359/489.19 |
| 2008/0025349 A1* | 1/2008 | Mizutani | ................. | H01S 5/141 372/20 |
| 2016/0116655 A1* | 4/2016 | Du | ....................... | G02B 5/3083 250/225 |
| 2018/0316154 A1* | 11/2018 | Azuma | ................. | G02B 5/284 |

* cited by examiner

WAVELENGTH MONITORING DEVICE, LIGHT SOURCE DEVICE, AND OPTICAL MODULE

CROSS-REFERENCE TO RELATED APPLICATION

This application is based upon and claims the benefit of priority of the prior Japanese Patent Application No. 2017-089908, filed on Apr. 28, 2017, the entire contents of which are incorporated herein by reference.

FIELD

The embodiments discussed herein are related to a wavelength monitoring device, a light source device, and an optical module.

BACKGROUND

Conventionally, there is a known light source device that is called a wavelength tunable light source and that has a function for adjusting the wavelength of light output from a laser to a predetermined target wavelength. In the wavelength tunable light source, a wavelength monitoring device is mounted and the wavelength of the light output from the laser is monitored by the wavelength monitoring device. Then, based on the monitoring results obtained by the wavelength monitoring device, the wavelength of the light output from the laser is adjusted to the predetermined target wavelength.

Some wavelength monitoring devices monitor the wavelength by using etalon elements having periodic transmission characteristics. In a wavelength monitoring device that uses an etalon element, input light is input to the etalon element and the input light transmitted through the etalon element is received by a photodiode (PD). Consequently, a monitor value for monitoring the wavelength of the input light is detected by the PD. The monitor value of the PD is periodically changed with respect to the wavelength of the input light. In other words, the etalon element has a transmission characteristic in which the monitor value of the PD is periodically changed with respect to the wavelength of the input light.

Here, in the vicinity of the peak and bottom of the transmission characteristics of the etalon element, even if the wavelength of the input light is changed, the monitor value of the PD is not greatly changed; therefore, it is difficult to accurately detect a wavelength change in the input light. In contrast, in an inclined portion of the transmission characteristic of the etalon element, even if the wavelength of the input light is slightly changed, the monitor value of the PD is greatly changed. Thus, in the wavelength monitoring device that uses an etalon element, in order to improve the detection accuracy of the wavelength change in the input light, a target wavelength of the input light (i.e., a target wavelength of a laser beam output from a laser) is set with respect to an inclined portion of the transmission characteristic of the etalon element.

However, according to international standards developed by the International Telecommunication Union (ITU) or the like, because a plurality of wavelengths may possibly be selected as the target wavelength of the input light, a situation in which the target wavelength of the input light is deviated from the inclined portion of the transmission characteristic of the etalon element is also conceived.

To avoid this situation, studies have been conducted on a method of duplexing the transmission characteristics of the etalon element and interpolating, the vicinity of the peak and bottom of, between the two transmission characteristics, the other one of transmission characteristics by the inclined portion of one of the transmission characteristics. Specifically, for example, a polarization switching element is disposed in front of the etalon element that is formed of a double refraction (birefringence) material; the polarization direction of the input light is switched, by the polarization switching element, between the directions parallel to and perpendicular to the optic axis (fast axis or slow axis) of the double refraction material; and introduces the input light onto the etalon element. Consequently, because the refractive index of the etalon element is changed in accordance with the polarization direction of the input light, two transmission characteristics having a phase difference can be obtained. Here, if the phase difference between the two transmission characteristics in the etalon element is $\pi/2$, between the two transmission characteristics, the vicinities of the peak and bottom of the other one of the transmission characteristics is interpolated by the inclined portion of one of the transmission characteristics. Consequently, the thickness of the etalon element is set to one of the types of thickness among a plurality of types of thickness in a case where the phase difference between the two transmission characteristics in the etalon element is $(\pi/2+2k\pi)$ (where, k is an integer).

Patent Document 1: Japanese Laid-open Patent Publication No. 2005-85904

Incidentally, it is known that the phase difference between the two transmission characteristics in the etalon element is inversely proportional to the wavelength of the input light. Thus, if the wavelength belonging to a wide wavelength band of, for example, the C-band is used as the wavelength of the input light, the phase difference between the two transmission characteristics in the etalon element is deviated from $\pi/2$ in edge wavelength in the wavelength band. As a result, because the target wavelength of the input light is easily deviated from the inclined portion of the transmission characteristics in the etalon element, in the wavelength monitoring device that uses the etalon element, the detection accuracy of the wavelength change of the input light is accordingly decreased.

Thus, in a case in which the phase difference between the two transmission characteristics in the etalon element is kept to $\pi/2$ in all of the wavelengths in the wide wavelength band, it is conceivable that the thickness of the etalon element is minimized. Namely, because the etalon element formed of the double refraction material has the same polarization characteristic as that of a high-order wave plate, it is known that an amount of shift of the phase difference between the two transmission characteristics with respect to $(\pi/2+2k\pi)$ is proportional to the thickness of the etalon element. Consequently, as the thickness of the etalon element is decreased, the phase difference between the two transmission characteristics approaches $\pi/2$.

However, when reducing the thickness of the etalon element, in each of the two transmission characteristics in the etalon element, a period called the Free Spectral Range (FSR) is increased. Namely, if the refractive index of the etalon element is represented by n, the thickness of the etalon element is represented by d, the wavelength of the input light to be input to the etalon element is represented by $\lambda$, the FSR is represented by $FSR=\lambda^2/(2nd)$ and the FSR is inversely proportional to the thickness of the etalon element. If the FSR is increased in each of the two transmission characteristics in the etalon element, the inclination of the inclined portion is decreased. As a result, in the wavelength monitoring device that uses the etalon element, the detection accuracy of the wavelength change in the input light is accordingly decreased.

SUMMARY

According to an aspect of an embodiment, a wavelength monitoring device includes a polarization rotation element that rotates a polarization direction of input light; an etalon element that includes a first double refractive layer and a single refractive layer or a second double refractive layer that is disposed by rotating an optic axis of the second double refractive layer by 90° with respect to an optic axis of the first double refractive layer; a polarization separating element that separates the input light, which has the polarization direction rotated by the polarization rotation element and is transmitted through the etalon element, into first light having a polarization direction parallel to the optic axis of the first double refractive layer and second light having a polarization direction perpendicular to the optic axis of the first double refractive layer; a first light receiving device that receives the first light to detect a first monitor value used to monitor a wavelength of the input light; and a second light receiving device that receives the second light to detect a second monitor value used to monitor the wavelength of the input light.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The disclosed technology is not limited to the embodiments.

[a] First Embodiment

Figure 1:
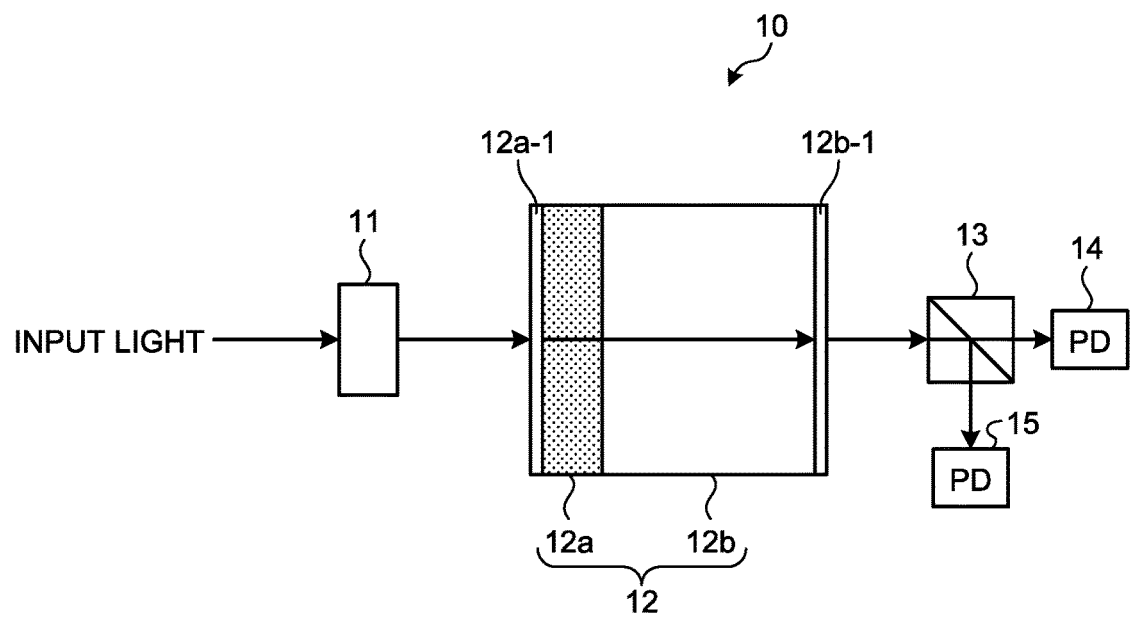
FIG. 1 is a diagram illustrating an example of the configuration of a wavelength monitoring device according to a first embodiment.

FIG. 1 is a diagram illustrating an example of the configuration of a wavelength monitoring device 10 according to a first embodiment. As illustrated in FIG. 1, the wavelength monitoring device 10 includes a polarization rotation element 11, an etalon element 12, a polarization beam splitter (PBS) 13, and PDs 14 and 15.

The polarization rotation element 11 is, for example, a Faraday rotator and rotates the polarization direction of input light. Specifically, the polarization rotation element 11 rotates the polarization direction of the input light such that the polarization direction of the input light is inclined by 45° ($\pi/4$) with respect to the optic axis of a double refractive layer 12a, which will be described later, of the etalon element 12. Furthermore, the rotation angle of the polarization direction of the input light is not limited to 45° as long as an arbitrary angle that is greater than 0° and less than 90° is used.

The etalon element 12 is an optical filter element having periodical transmission characteristics and performs multiple reflection on the input light that is transmitted through the polarization rotation element 11 and that is incident. The etalon element 12 includes a double refractive layer 12a disposed on the input surface side of the light and a single refractive layer 12b disposed on the output surface side of the light. The double refractive layer 12a is formed of a double refraction material, such as crystal. The single refractive layer 12b is formed of a single refraction material, such as optical glass. On the input surface of the double refractive layer 12a and on the output surface of the single refractive layer 12b, reflection films 12a-1 and 12b-1 having the reflectance of about 20% are formed, respectively.

Figure 2:
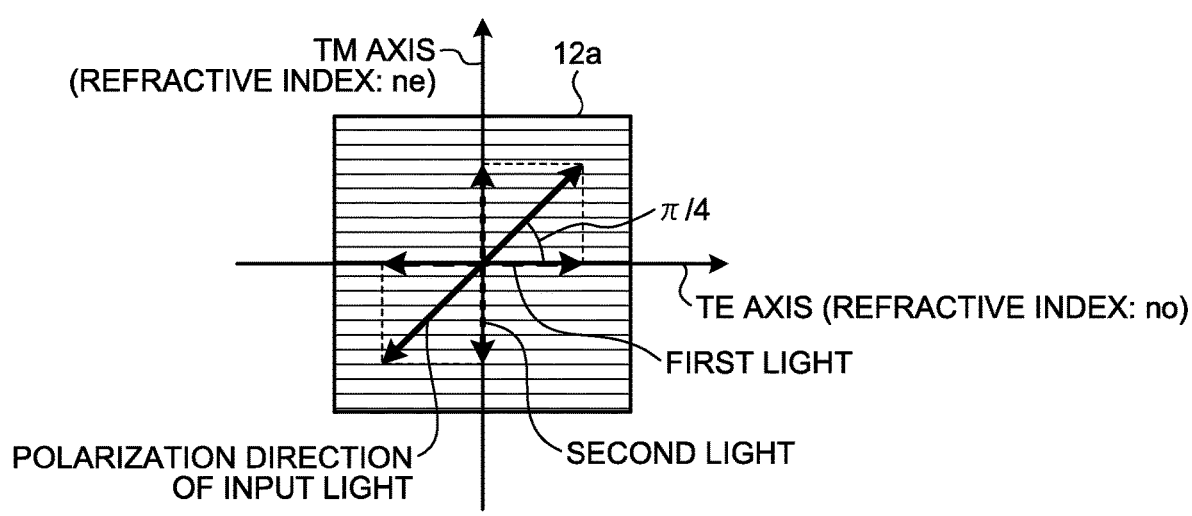
FIG. 2 is a diagram illustrating an example of the relationship among the optic axis of a double refractive layer in an etalon element according to the first embodiment, the polarization direction of input light that is transmitted through a polarization rotation element and is incident on the etalon element, and the input light that has been transmitted through the etalon element.

FIG. 2 is a diagram illustrating an example of the relationship among the optic axis of the double refractive layer 12a in the etalon element 12 according to the first embodiment, the polarization direction of the input light that is transmitted through the polarization rotation element 11 and is incident on the etalon element 12, and the input light that has been transmitted through the etalon element 12. In FIG. 2, the axis parallel to the optic axis of the double refractive layer 12a is the TE axis and the axis perpendicular to the optic axis of the double refractive layer 12a is the TM axis. Because the double refractive layer 12a is formed of a double refraction material, the refractive index no of the double refractive layer 12a associated with the TE axis is different from the refractive index ne of the double refractive layer 12a associated with the TM axis. As described above, the polarization direction of the input light is rotated by the polarization rotation element 11 so as to be inclined by 45° ($\pi/4$) with respect to the optic axis of the double refractive layer 12a. Thus, as illustrated in FIG. 2, the polarization direction of the input light that passes through the polarization rotation element 11 and that is incident on the etalon element 12 is inclined by 45° (π/4) with respect to the TE axis. Consequently, in the input light transmitted through the etalon element 12, "first light" having the polarization direction parallel to the optic axis of the double refractive layer 12a and "second light" having the polarization direction perpendicular to the optic axis of the double refractive layer 12a are included. Because the refractive index no associated with the TE axis that is parallel to the optic axis of the double refractive layer 12a is different from the refractive index ne associated with the TM axis that is perpendicular to the optic axis of the double refractive layer 12a, a phase difference is generated between the "first light" and the "second light". Consequently, in the etalon element 12, two periodic transmission characteristics having a phase difference are obtained. These two transmission characteristics in the etalon element 12 will be described later.

A description will be given here by referring back to FIG. 1. The PBS 13 splits the input light that has the polarization direction rotated by the polarization rotation element 11 and that has been transmitted through the etalon element 12 into the above described "first light" and above described the "second light". Namely, the PBS 13 separates the "first light" and the "second light" that have the phase difference, outputs the "first light" to the PD 14, and outputs the "second light" to the PD 15.

The PD 14 receives the "first light" output from the PBS 13 and detects a "first monitor value" that is used to monitor the wavelength of the input light.

The PD 15 receives the "second light" output from the PBS 13 and detects a "second monitor value" that is used to monitor the wavelength of the input light.

Figure 3:
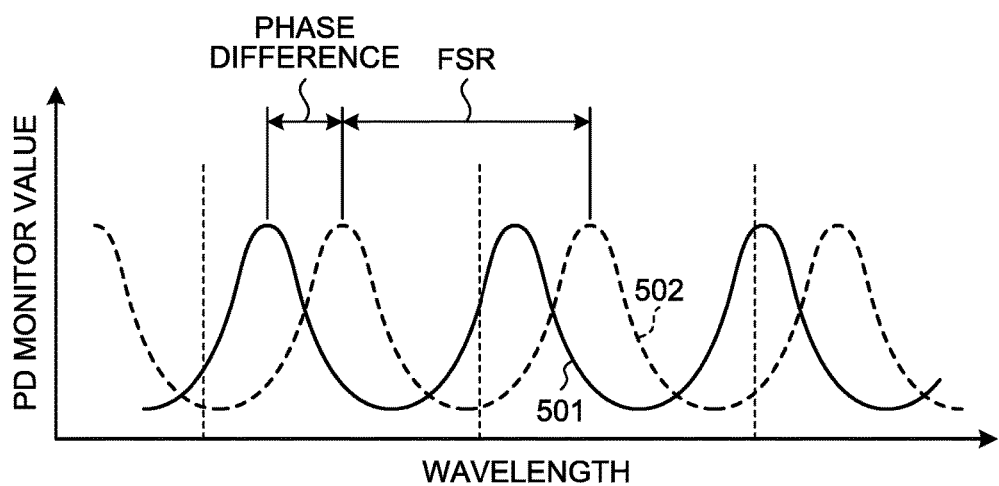
FIG. 3 is a diagram illustrating two transmission characteristics in the etalon element according to the first embodiment.

FIG. 3 is a diagram illustrating two transmission characteristics in the etalon element 12 according to the first embodiment. In FIG. 3, the horizontal axis indicates the wavelength of the input light and the vertical axis indicates the monitor values of the PDs 14 and 15 (i.e., the "first monitor value" and the "second monitor value" described above). The etalon element 12 has, as illustrated in FIG. 3, a first transmission characteristic 501 and a second transmission characteristic 502 that are two periodic transmission characteristics having a phase difference. The first transmission characteristic 501 is a transmission characteristic associated with the direction parallel to the optic axis of the double refractive layer 12a (i.e., the direction of the TE axis) and the second transmission characteristic 502 is a transmission characteristic associated with the direction perpendicular to the optic axis of the double refractive layer 12a (i.e., the direction of the TM axis). Furthermore, in the first transmission characteristic 501, the "first monitor value" described above is periodically changed with respect to the wavelength of the input light, whereas, in the second transmission characteristic 502, the "second monitor value" described above is periodically changed with respect to the wavelength of the input light. If the phase difference between the first transmission characteristic 501 and the second transmission characteristic 502 is π/2, the peak portion and the bottom portion of, between the first transmission characteristic 501 and the second transmission characteristic 502, the other one of the transmission characteristics is subjected to interpolation by the inclined portion of the one of the transmission characteristics. Specifically, regarding the target wavelength of the input light indicated by the broken line illustrated in FIG. 3, in a case where the phase difference between the first transmission characteristic 501 and the second transmission characteristic 502 is π/2, the target wavelength of the input light associated with the bottom portion of the second transmission characteristic 502 is associated with the inclined portion of the first transmission characteristic 501. In contrast, the target wavelength of the input light associated with the peak portion of the first transmission characteristic 501 is associated with the inclined portion of the second transmission characteristic 502. In this way, when the first transmission characteristic 501 and the second transmission characteristic 502 have a mutually complementary relationship, because it is possible to avoid a situation in which the target wavelength of the input light is deviated from the inclined portion of the first transmission characteristic 501 or the second transmission characteristic 502, it is preferable that the phase difference between the first transmission characteristic 501 and the second transmission characteristic 502 be π/2.

Here, the phase difference between the two transmission characteristics in the etalon element 12 is represented by Equation (1) below:

$$\Delta\phi = 4\pi(no-ne)d/\lambda \tag{1}$$

where, no is the refractive index of the double refractive layer 12a associated with the TE axis, ne is the refractive index of the double refractive layer 12a associated with the TM axis, d is the thickness of the double refractive layer 12a, and λ is the wavelength of the input light.

In Equation (1), if the center wavelength of the used wavelength band (for example, the C-band) is λ0, a plurality of types of thickness in a case where the phase difference Δφ between the two transmission characteristics in the etalon element 12 becomes (π/2+2kπ) (where, k is an integer) are present, as represented by Equation (2) below:

$$d = (\frac{1}{4}+k)\lambda 0/\{2(no-ne)\} \tag{2}$$

When referring to Equation (1) above, the phase difference Δφ between the two transmission characteristics in the etalon element 12 is inversely proportional to the wavelength λ of the input light. Consequently, if the wavelength belonging to a wide wavelength band of, for example, the C-band or the like is used as the wavelength of the input light, in the edge wavelength of the wavelength band, the phase difference between the two transmission characteristics in the etalon element 12 is shifted from π/2. As a result, because the target wavelength of the input light is easily deviated from the inclined portion of the transmission characteristics in the etalon element 12, in the wavelength monitoring device 10 that uses the etalon element 12, the detection accuracy of the wavelength change in the input light is accordingly decreased.

Thus, in the embodiment, the thickness of the double refractive layer 12a in the etalon element 12 is minimized. Specifically, from among a plurality of types of thickness (i.e., the thickness d in Equation (2) above) in a case where the phase difference Δφ between the first transmission characteristic 501 and the second transmission characteristic 502 is (π/2+2kπ) (where, k is an integer), the thickness of the double refractive layer 12a is set to the thickness associated with k that is equal to or less than a predetermined value. As the predetermined value, a different value is appropriately set in accordance with the double refraction material and the used wavelength band in the double refractive layer 12a. For example, if the double refraction material of the double refractive layer 12a is crystal and the used wavelength band is the C-band, 1 is set as a predetermined value. In this case, the thickness of the double refractive layer 12a is set to the thickness associated with k=0 or the thickness associated with k=1 indicated by the thickness d in Equation (2) described above. The thickness associated with k=0 corresponds to the thickness of a zero-order ⅛ wave plate and the thickness associated with k=1 corresponds to the thickness of a first-order ⅛ wave plate. In this way, by minimizing the thickness of the double refractive layer 12a in the etalon element 12, for example, in a wide wavelength band, such as the C-band, the phase difference between the two transmission characteristics in the etalon element 12 is maintained to π/2.

However, when reducing the thickness of the double refractive layer 12a in the etalon element 12, a period called the FSR is increased in each of the first transmission characteristic 501 and the second transmission characteristic 502 in the etalon element 12. Namely, the FSR is inversely proportional to the entire thickness of the etalon element 12. In each of the first transmission characteristic 501 and the second transmission characteristic 502 in the etalon element 12, if the FSR is large, the inclination of the inclined portion becomes small. As a result, in the wavelength monitoring device 10 that uses the etalon element 12, the detection accuracy of the wavelength change in the input light is reduced.

Thus, in the embodiment, a shortfall of the thickness of the double refractive layer 12a in the etalon element 12 is compensated by the thickness of the single refractive layer 12b and the entire thickness of the etalon element 12 is made large. Specifically, the sum of the thickness of the double refractive layer 12a and the thickness of the single refractive layer 12b is set such that the FSR of the first transmission characteristic 501 and the FSR of the second transmission characteristic 502 that are inversely proportional to the subject sum become equal to or less than the target FSR. The target FSR is, for example, 0.4 nm. In this way, by compensating the shortfall of the thickness of the double refractive layer 12a by the thickness of the single refractive layer 12b, the phase difference between the first transmission characteristic 501 and the second transmission characteristic 502 is maintained to π/2 in a wide wavelength band and, also, the inclination of the inclined portion of each of the first transmission characteristic 501 and the second transmission characteristic 502 is increased.

As described above, according to the embodiment, the input light transmitted through the etalon element that has a double refractive layer and a single refractive layer is separated into the light having the polarization direction parallel to the optic axis of the double refractive layer and the light having the polarization direction perpendicular to the optic axis of the double refractive layer. Then, the separated two pieces of light are received by the two PDs and two monitor values used to monitor the wavelength of the input light are detected. Consequently, even if the thickness of the double refractive layer in the etalon element is made small, the shortfall of the thickness of the double refractive layer is compensated by the thickness of the single refractive layer. Thus, the phase difference between the two periodic transmission characteristics that are exhibited in the etalon element, that are associated with the two monitor values, and that have a phase difference is maintained to π/2 and the FSR of each of the two transmission characteristics becomes equal to or less than the target FSR. As a result, it is possible to improve the detection accuracy of the wavelength change in a wavelength band, such as the C-band.

[b] Second Embodiment

A feature of a second embodiment is that two transmission characteristics in the etalon element are obtained by normalizing the two monitor values, which are used to monitor the wavelength of input light, by an optical power value of the input light.

Figure 4:
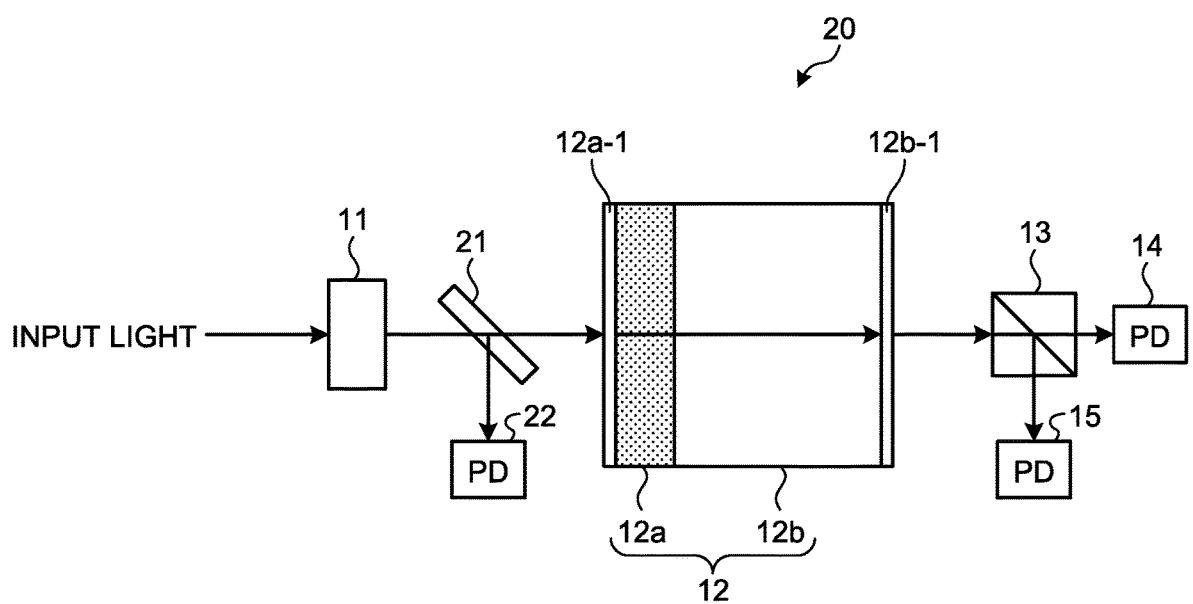
FIG. 4 is a diagram illustrating an example of the configuration of a wavelength monitoring device according to a second embodiment.

FIG. 4 is a diagram illustrating an example of the configuration of a wavelength monitoring device 20 according to the second embodiment. In FIG. 4, components having the same configuration as those illustrated in FIG. 1 are assigned the same reference numerals and descriptions thereof will be omitted. As illustrated in FIG. 4, the wavelength monitoring device 20 includes, in addition to the configuration illustrated in FIG. 1, a half mirror 21 and a PD 22.

The half mirror 21 is disposed between the polarization rotation element 11 and the etalon element 12. The input light transmitted through the polarization rotation element 11 is incident on the etalon element 12 and the PD 22 via the half mirror 21.

The PD 22 receives the input light transmitted through the polarization rotation element 11 and detects an "optical power value of the input light". The "optical power value of the input light" detected by the PD 22 is used to normalize the "first monitor value" and the "second monitor value" detected by the PDs 14 and 15. Namely, the first transmission characteristic 501 exhibited in the etalon element 12 is obtained by dividing a "first monitor value" by the "optical power value of the input light". Furthermore, the second transmission characteristic 502 exhibited in the etalon element 12 is obtained by dividing a "second monitor value" by the "optical power value of the input light".

As described above, according to the embodiment, two transmission characteristics exhibited in the etalon element are obtained by normalizing the two monitor values used to monitor the wavelength of the input light by an optical power value of the input light. Consequently, because the effect of a minute variation in the optical power value of the input light is excluded from the two transmission characteristics exhibited in the etalon element, it is possible to further improve the detection accuracy of the wavelength change.

[c] Third Embodiment

A feature of a third embodiment is that the size of a device is reduced by disposing a polarization switching element instead of the polarization rotation element, by switching the polarization direction, and by receiving the input light transmitted through the etalon element by a single PD.

Figure 5:
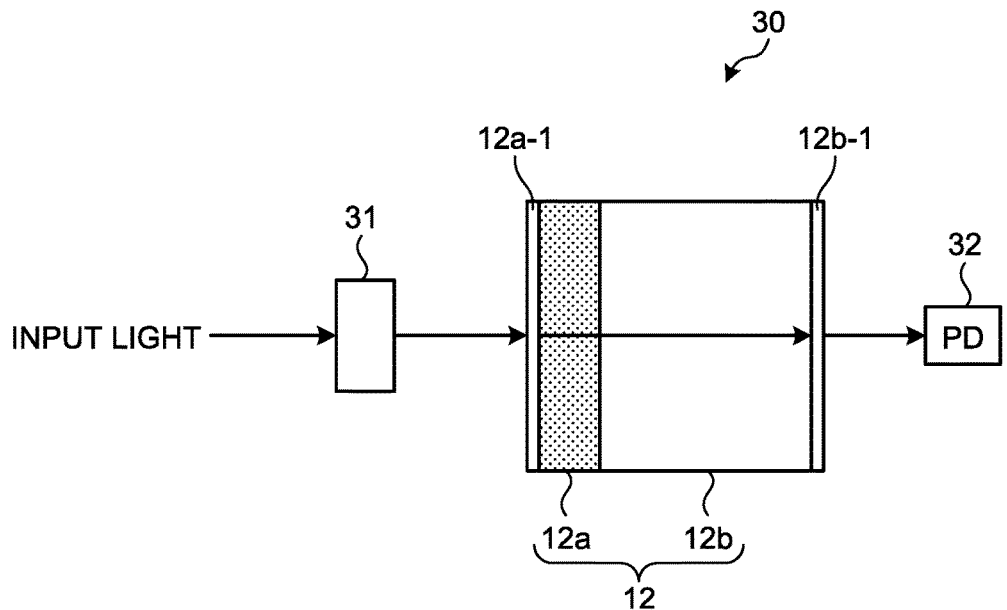
FIG. 5 is a diagram illustrating an example of the configuration of a wavelength monitoring device according to a third embodiment.

FIG. 5 is a diagram illustrating an example of the configuration of a wavelength monitoring device 30 according to the third embodiment. In FIG. 5, components having the same configuration as those illustrated in FIG. 1 are assigned the same reference numerals and descriptions thereof will be omitted. As illustrated in FIG. 5, the wavelength monitoring device 30 includes, instead of the polarization rotation element 11 illustrated in FIG. 1, a polarization switching element 31. Furthermore, the wavelength monitoring device 30 includes a PD 32 instead of the PBS 13, the PD 14, and the PD 15 illustrated in FIG. 1.

The polarization switching element 31 is, for example, a liquid crystal element and switches the polarization direction of the input light. Specifically, the polarization switching element 31 switches, in accordance with on or off of the polarization switching element 31, the polarization direction of the input light to the direction parallel to or perpendicular to the optic axis of the double refractive layer 12a in the etalon element 12.

The etalon element 12 is an optical filter element having periodic transmission characteristics, performs multiple reflection on the input light transmitted through the polarization switching element 31, and passes the input light.

Figure 6:
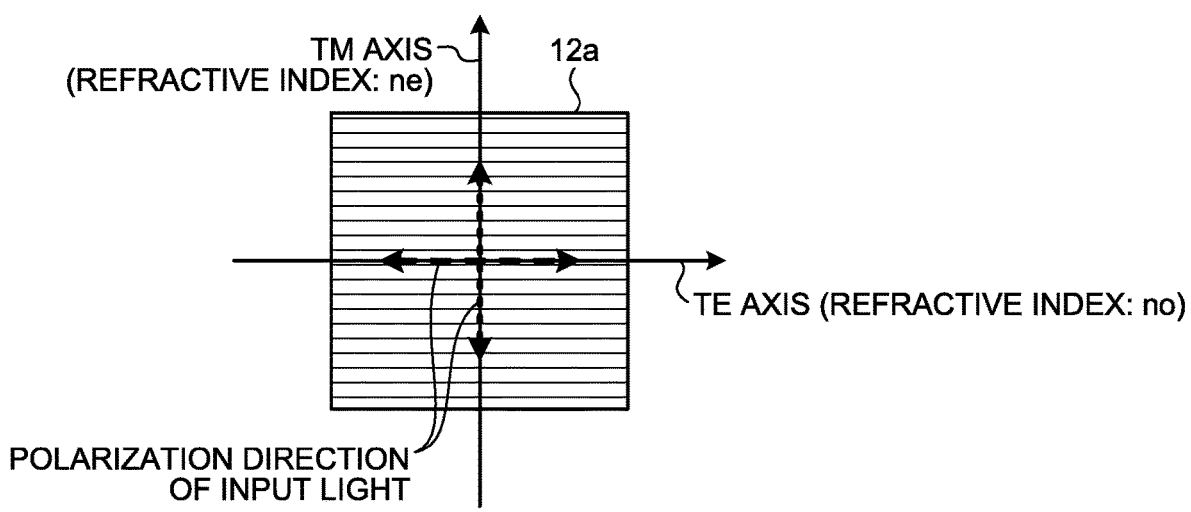
FIG. 6 is a diagram illustrating an example of the relationship among the optic axis of a double refractive layer in an etalon element according to the third embodiment, the polarization direction of the input light that is transmitted through a polarization switching element and is incident on the etalon element, and the input light that has been transmitted through the etalon element.

FIG. 6 is a diagram illustrating an example of the relationship among the optic axis of the double refractive layer 12a in the etalon element 12 according to the third embodiment, the polarization direction of the input light that is transmitted through the polarization switching element 31 and is incident on the etalon element 12, and the input light that has transmitted through the etalon element 12. In FIG. 6, the axis parallel to the optic axis of the double refractive layer 12a is the TE axis and the axis perpendicular to the optic axis of the double refractive layer 12a is the TM axis. Because the double refractive layer 12a is formed of a double refraction material, the refractive index no of the double refractive layer 12a associated with the TE axis is different from the refractive index ne of the double refractive layer 12a associated with the TM axis. As described above, the polarization direction of the input light is switched, by the polarization switching element 31, to the direction parallel to or perpendicular to the optic axis of the double refractive layer 12a in the etalon element 12. Thus, as illustrated in FIG. 6, the polarization direction of the input light that passes through the polarization switching element 31 and that is incident on the etalon element 12 is switched to the direction of the TE axis or the TM axis. Consequently, a phase difference is generated between the input light that has the polarization direction switched to the direction of the TE axis and that has transmitted through the etalon element 12 and the input light that has the polarization direction switched to the direction of the TM axis and that has transmitted through the etalon element 12. Consequently, in the etalon element 12, two periodic transmission characteristics having the phase difference is obtained. The two transmission characteristics in the etalon element 12 will be described later.

A description will be given here by referring back to FIG. 5. The PD 32 receives the input light that has the polarization direction, which has been switched to the direction parallel to the optic axis of the double refractive layer 12a (i.e., the direction of the TE axis) by the polarization switching element 31, and that has transmitted through the etalon element 12 and then detects the "first monitor value" that is used to monitor the wavelength of the input light. Furthermore, the PD 32 receives the input light that has the polarization direction, which has been switched to the direction perpendicular to the optic axis of the double refractive layer 12a (i.e., the direction of the TM axis) by the polarization switching element 31, and that has transmitted through the etalon element 12 and then detects the "second monitor value" that is used to monitor the wavelength of the input light.

Figure 7:
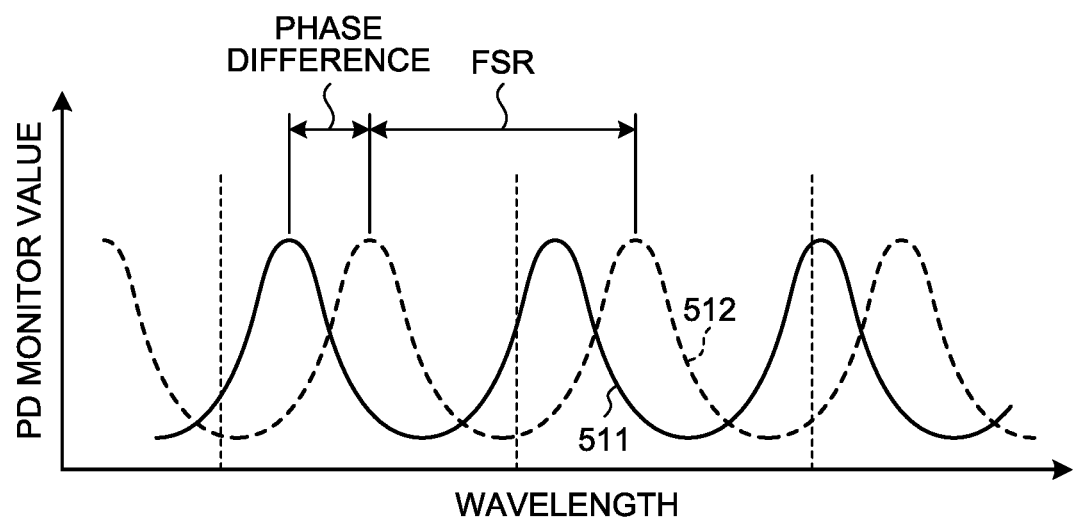
FIG. 7 is a diagram illustrating two transmission characteristics in the etalon element according to the third embodiment.

FIG. 7 is a diagram illustrating two transmission characteristics in the etalon element 12 according to the third embodiment. In FIG. 7, the horizontal axis indicates the wavelength of the input light and the vertical axis indicates the monitor values of the PD 32 (i.e., the "first monitor value" and the "second monitor value" described above). The etalon element 12 has, as illustrated in FIG. 7, a first transmission characteristic 511 and a second transmission characteristic 512 that are two periodic transmission characteristics having a phase difference. The first transmission characteristic 511 is a transmission characteristic associated with the direction parallel to the optic axis of the double refractive layer 12a (i.e., the direction of the TE axis) and the second transmission characteristic 512 is a transmission characteristic associated with the direction perpendicular to the optic axis of the double refractive layer 12a (i.e., the direction of the TM axis). Furthermore, in the first transmission characteristic 511, the "first monitor value" described above is periodically changed with respect to the wavelength of the input light, whereas, in the second transmission characteristic 512, the "second monitor value" described above is periodically changed with respect to the wavelength of the input light. If the phase difference between the first transmission characteristic 511 and the second transmission characteristic 512 is $\pi/2$, the peak portion and the bottom portion of, between the first transmission characteristic 511 and the second transmission characteristic 512, the other one of the transmission characteristics is subjected to interpolation by the inclined portion of the one of the transmission characteristics. Specifically, regarding the target wavelength of the input light is indicated by the broken line illustrated in FIG. 7, in a case where the phase difference between the first transmission characteristic 511 and the second transmission characteristic 512 is $\pi/2$, the target wavelength of the input light associated with the bottom portion of the second transmission characteristic 512 is associated with the inclined portion of the first transmission characteristic 511. In contrast, the target wavelength of the input light associated with the peak portion of the first transmission characteristic 511 is associated with the inclined portion of the second transmission characteristic 512. In this way, when the first transmission characteristic 511 and the second transmission characteristic 512 have a mutually complementary relationship, because it is possible to avoid a situation in which the target wavelength of the input light is deviated from the inclined portion of the first transmission characteristic 511 or the second transmission characteristic 512, it is preferable that the phase difference between the first transmission characteristic 511 and the second transmission characteristic 512 be $\pi/2$.

Thus, in the embodiment, the thickness of the double refractive layer 12a is set to the thickness associated with k that is equal to or less than a predetermined value from among a plurality of types of thickness (i.e., the thickness d represented by Equation (2) above) in a case where the phase difference $\Delta\phi$ between the first transmission characteristic 511 and the second transmission characteristic 512 is $(\pi/2 + 2k\pi)$ (where, k is an integer). Furthermore, the sum of the thickness of the double refractive layer 12a and the thickness of the single refractive layer 12b is set such that the FSR of the first transmission characteristic 511 and the FSR of the second transmission characteristic 512 that are inversely proportional to the subject sum become equal to or less than the target FSR.

As described above, according to the embodiment, the polarization direction is switched by the polarization switching element, the input light transmitted through the etalon element that has a double refractive layer and a single refractive layer is received by a single PD, and two monitor values that are used to monitor the wavelength of the input light is detected. Consequently, even if the thickness of the double refractive layer in the etalon element is made small, a shortfall of the thickness of the double refractive layer is compensated by the thickness of the single refractive layer. Thus, the phase difference between the two periodic transmission characteristics that are exhibited in the etalon element, that are associated with the two monitor values, and that have a phase difference is maintained to $\pi/2$ and the FSR of each of the two transmission characteristics becomes equal to or less than the target FSR. As a result, it is possible to improve the detection accuracy of the wavelength change in a wavelength band, such as the C-band. Furthermore, according to the embodiment, because the PBS can be eliminated and the number of PDs can be reduced, it is possible to reduce the size of the wavelength monitoring device 30.

[d] Fourth Embodiment

A fourth embodiment relates to a variation in the etalon element included in the first embodiment.

The configuration of the wavelength monitoring device according to the fourth embodiment is the same as that of the wavelength monitoring device 10 according to the first embodiment; therefore, descriptions thereof will be omitted. In the fourth embodiment, the configuration of the etalon element 12 is different from that described in the first embodiment.

Figure 8:
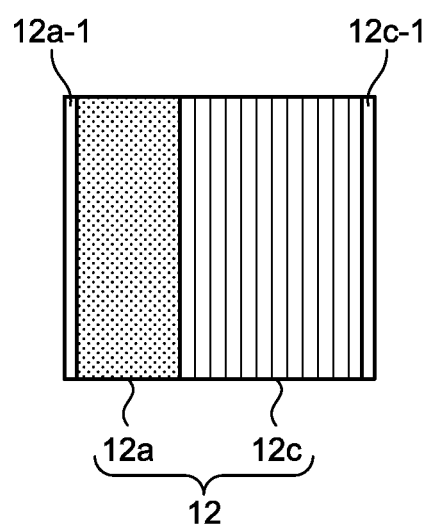
FIG. 8 is a diagram illustrating an example of the configuration of an etalon element according to a fourth embodiment.

FIG. 8 is a diagram illustrating an example of the configuration of the etalon element 12 according to a fourth embodiment. The etalon element 12 is an optical filter element having periodic transmission characteristics and performs multiple reflection on the input light transmitted through the polarization rotation element 11, and passes the input light. The etalon element 12 includes, as illustrated in FIG. 8, the double refractive layer 12a disposed on the input surface side of the light and a double refractive layer 12c disposed on the output surface side of the light. The double refractive layer 12a is associated with the double refractive layer 12a according to the first embodiment. The double refractive layer 12c is formed of, similarly to the double refractive layer 12a, a double refraction material, such as crystal. However, the optic axis of the double refractive layer 12c is disposed by being rotated by 90° with respect to the optic axis of the double refractive layer 12a. On the input surface of the double refractive layer 12a and on the output surface of the double refractive layer 12c, the reflection films 12a-1 and 12c-1 with the reflectance of about 20% are formed, respectively.

In the embodiment, the difference between the thickness of the double refractive layer 12a and the thickness of the double refractive layer 12c is set to the thickness associated with k equal to or less than the predetermined value from among a plurality of types of thickness (i.e., the thickness d in Equation (2) above) in a case where the phase difference $\Delta\phi$ between the first transmission characteristic 501 and the second transmission characteristic 502 is $(\pi/2+2k\pi)$ (where, k is an integer). Furthermore, the sum of the thickness of the double refractive layer 12a and the thickness of the double refractive layer 12c is set such that the FSR of the first transmission characteristic 501 and the FSR of the second transmission characteristic 502 that are inversely proportional to the subject sum become equal to or less than the target FSR.

As described above, according to the embodiment, the input light transmitted through the etalon element that has two double refractive layers having the optical axes each of which is shifted by 90° is separated into the light having the polarization direction parallel to the optic axis of one of the double refractive layers and the light having the polarization direction perpendicular to the optic axis of the other one of the double refractive layers. Then, the separated two pieces of light are received by the two PDs and then two monitor values used to monitor the wavelength of the input light are detected. Consequently, even if the thickness of one of the double refractive layers in the etalon element is made small, a shortfall of the thickness of the double refractive layer is compensated by the thickness of the other one of the double refractive layer. Thus, the phase difference between the two transmission characteristics that are exhibited in the etalon element, that are associated with two monitor values, and that have a phase difference is maintained to $\pi/2$ and the FSR of each of the two transmission characteristics becomes equal to or less than the target FSR. As a result, it is possible to improve the detection accuracy of the wavelength change in a wavelength band, such as the C-band.

Application Example

Figure 9:
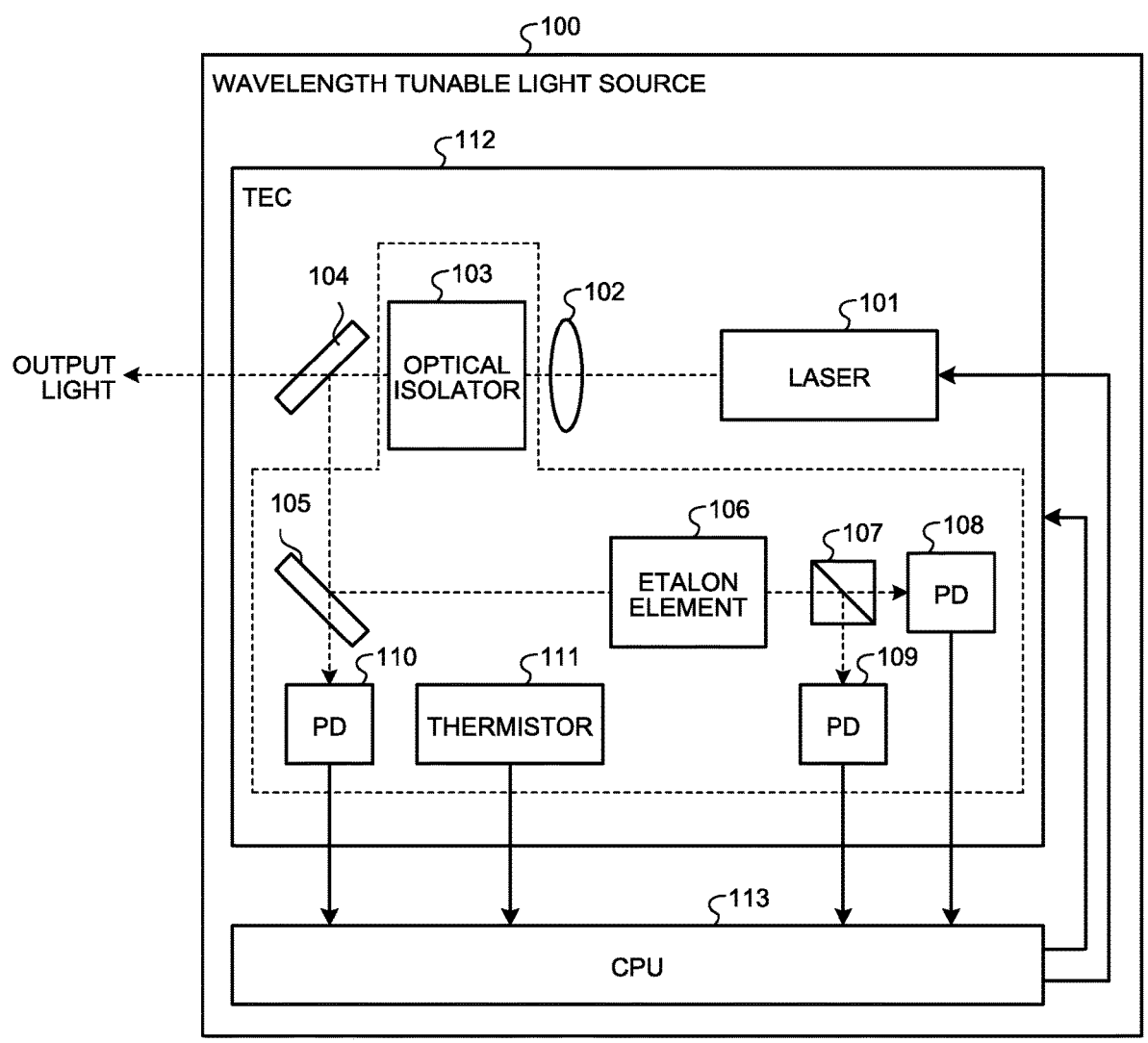
FIG. 9 is a block diagram illustrating a configuration example of a wavelength tunable light source.

The wavelength monitoring device described in each of the embodiments can be used for a light source device or the like called a wavelength tunable light source having the function of adjusting the wavelength of a laser beam output from a laser at a predetermined target wavelength. FIG. 9 is a block diagram illustrating a configuration example of a wavelength tunable light source 100. Furthermore, in FIG. 9, as an example, a description will be given of a wavelength tunable light source 100 in which the wavelength monitoring device 20 according to the second embodiment is disposed.

As illustrated in FIG. 9, the wavelength tunable light source 100 includes a laser 101, a lens 102, an optical isolator 103, half mirrors 104 and 105, an etalon element 106, a PBS 107, PDs 108 and 109, a PD 110, and a thermistor 111. Furthermore, the wavelength tunable light source 100 includes a thermoelectric cooler (TEC) 112, and a central processing unit (CPU) 113.

The laser 101 is a laser that can change the wavelength of the light to be output and outputs the light having a predetermined wavelength. The light output from the laser 101 (hereinafter, referred to as a "laser beam") is input to the optical isolator 103 via the lens 102.

The optical isolator 103 transmits the laser beam in one direction. Furthermore, the optical isolator 103 includes a Faraday rotator and rotates, at the time of transmission of the laser beam, the polarization direction of the laser beam. The optical isolator 103 is associated with the polarization rotation element 11 described in the second embodiment.

The laser beam transmitted through the optical isolator 103 is split by the half mirror 104 and one of the laser beams obtained by the branch is output to, as an output beam, for example, an optical fiber. In contrast, the other one of the laser beams obtained by the branch is incident on the etalon element 106 and the PD 110 via the half mirror 105. The half mirror 105 is associated with the half mirror 21 described in the second embodiment.

The etalon element 106 is an optical filter element having periodic transmission characteristics, performs multiple reflection on the laser beam incident from the half mirror 105, and transmits the laser beam. The etalon element 106 includes a double refractive layer disposed on the input surface side of the beam and a single refractive layer disposed on the output surface side of the beam. The etalon element 106 includes two periodic transmission characteristics having a phase difference. The etalon element 106 is associated with the etalon element 12 described in the second embodiment.

The PBS 107 splits the laser beam transmitted from the etalon element 106 into the "first light" having the polarization direction parallel to the optic axis of the double refractive layer in the etalon element 106 and the "second light" having the polarization direction perpendicular to the optic axis of the etalon element 106. The PBS 107 is associated with the PBS 13 described in the second embodiment.

The PD 108 receives the "first light" that is output from the PBS 107, detects the "first monitor value" that is used to monitor the wavelength of the laser beam, and outputs the detected "first monitor value" to the CPU 113. The PD 108 is associated with the PD 14 described in the second embodiment.

The PD 109 receives the "second light" that is output from the PBS 107, detects the "second monitor value" that is used to monitor the wavelength of the laser beam, and outputs the detected "second monitor value" to the CPU 113. The PD 109 is associated with the PD 15 described in the second embodiment.

The PD 110 receives the laser beam transmitted through the optical isolator 103, detects the "optical power value of the laser beam", and outputs the detected "power value of the laser beam" to the CPU 113. The PD 110 is associated with the PD 22 described in the second embodiment.

With the configuration described above, the optical isolator 103, the half mirror 105, the etalon element 106, the PBS 107, the PD 108, the PD 109, and the PD 110 form the wavelength monitoring device 20 according to the second embodiment and monitors the wavelength of the laser beam. Then, the "first monitor value", the "second monitor value", and the like are output to the CPU 113 as the results of monitoring the wavelength of the laser beam. Then, based on the results of monitoring the wavelength of the laser beam, the CPU 113 performs wavelength control so that the wavelength of the laser beam output from the laser 101 is adjusted to a predetermined target wavelength. For example, the CPU 113 normalizes the "first monitor value" and the "second monitor value" by the "optical power value of the laser beam", obtains two transmission characteristics in the etalon element 106, and performs the wavelength control by using the two obtained transmission characteristics. Consequently, the wavelength of the laser beam is adjusted to the target wavelength with high accuracy.

The thermistor 111 measures a temperature of the TEC 112.

A TEC 112 includes the laser 101, the lens 102, the optical isolator 103, the half mirrors 104 and 105, the etalon element 106, the PBS 107, the PDs 108 and 109, the PD 110, and the thermistor 111. Then, the TEC 112 keeps, in accordance with an instruction from the CPU 113, the temperature of each of the mounted components constant. Namely, the CPU 113 compares the temperature detected by the thermistor 111 with a predetermined temperature and adjusts the temperature of the TEC 112 in accordance with the comparison result.

Application Example

Figure 10:
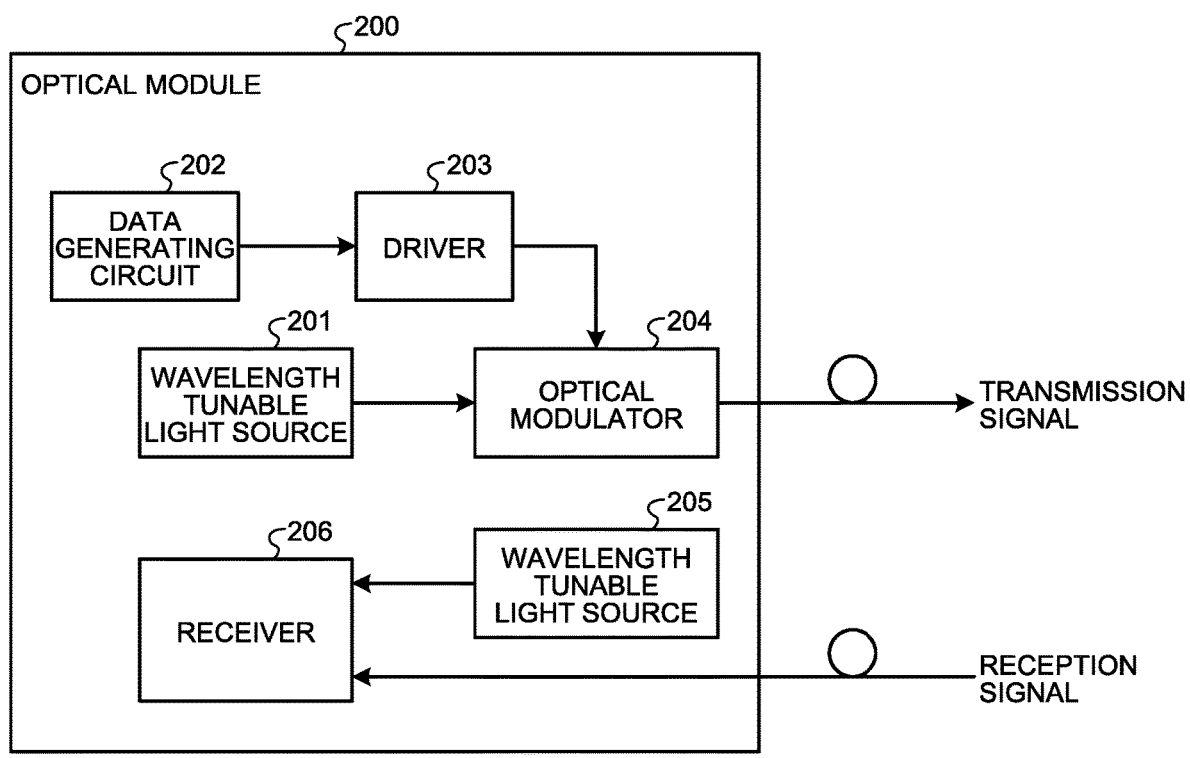
FIG. 10 is a block diagram illustrating a configuration example of an optical module.

The wavelength tunable light source described in the application example can be used various optical modules. FIG. 10 is a block diagram illustrating a configuration example of an optical module 200. As illustrated in FIG. 10, the optical module 200 includes a wavelength tunable light source 201, a data generating circuit 202, a driver 203, an optical modulator 204, a wavelength tunable light source 205, and a receiver 206.

The wavelength tunable light source 201 and the wavelength tunable light source 205 are the wavelength tunable light source described in the application example described above and outputs light having a predetermined wavelength. The light output from the wavelength tunable light source 201 is input to the optical modulator 204 and the light output from the wavelength tunable light source 205 is input to the receiver 206.

The data generating circuit 202 generates transmission data. The transmission data is input to the driver 203 and a radio frequency (RF) signal having the waveform in accordance with the transmission data is generated by the driver 203. Then, the RF signal is input to the optical modulator 204.

The optical modulator 204 performs optical modulation on the light from the wavelength tunable light source 201 by using the RF signal received from the driver 203 and outputs a transmission signal that is the obtained optical signal to, for example, optical fibers.

The receiver 206 receives a reception signal that is an optical signal via, for example, the optical fibers, demodulates the received reception signal by using the light received from the wavelength tunable light source 205, and obtains reception data included in the reception signal. The reception data obtained by the receiver 206 is output a higher-level device.

According to an aspect of the wavelength monitoring device disclosed in the present invention, an advantage is provided in that it is possible to improve the detection accuracy of wavelength change in a wide wavelength band.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wavelength monitoring device comprising:
a polarization rotation element that rotates a polarization direction of input light;
an etalon element that includes a first double refractive layer and a single refractive layer that is thicker than the first double refractive layer or a second double refractive layer that is disposed by rotating an optic axis of the second double refractive layer by 90° with respect to an optic axis of the first double refractive layer and that is thicker than the first double refractive layer;
a polarization separating element that separates the input light, which has the polarization direction rotated by the polarization rotation element and is transmitted through the etalon element, into first light having a polarization direction parallel to the optic axis of the first double refractive layer and second light having a polarization direction perpendicular to the optic axis of the first double refractive layer;
a first light receiving device that receives the first light to detect a first monitor value used to monitor a wavelength of the input light; and
a second light receiving device that receives the second light to detect a second monitor value used to monitor the wavelength of the input light.

2. The wavelength monitoring device according to claim 1, wherein
the etalon element has a first transmission characteristic that is associated with a direction parallel to the optic axis of the first double refractive layer and in which the first monitor value is periodically changed with respect to the wavelength of the input light and a second transmission characteristic that is associated with a direction perpendicular to the optic axis of the first double refractive layer and in which the second monitor value is periodically changed with respect to the wavelength of the input light, a thickness of the first double refractive layer is set to a thickness, from among a plurality of types of thickness in a case where a phase difference between the first transmission characteristic and the second transmission characteristic in the etalon element is $(\pi/2+2k\pi)$ (where, k is an integer), associated with k that is equal to or less than a predetermined value, and a sum of the thickness of the first double refractive layer and the thickness of the single refractive layer is set such that a period of the first transmission characteristic and a period of the second transmission characteristic that are inversely proportional to the sum become equal to or less than a target period.

3. The wavelength monitoring device according to claim 1, wherein the etalon element has a first transmission characteristic that is associated with a direction parallel to the optic axis of the first double refractive layer and in which the first monitor value is periodically changed with respect to the wavelength of the input light and a second transmission characteristic that is associated with a direction perpendicular to the optic axis of the first double refractive layer and in which the second monitor value is periodically changed with respect to the wavelength of the input light, a difference between a thickness of the first double refractive layer and a thickness of the second double refractive layer is set to a thickness, from among a plurality of types of thickness in a case where a phase difference between the first transmission characteristic and the second transmission characteristic in the etalon element is $(\pi/2\pm 2k)$ (where, k is an integer), associated with k that is equal to or less than a predetermined value, and a sum of the thickness of the first double refractive layer and the thickness of the second double refractive layer is set such that a period of the first transmission characteristic and a period of the second transmission characteristic that are inversely proportional to the sum become equal to or less than a target period.

4. The wavelength monitoring device according to claim 2, further comprising another light receiving device that receives the input light that has not been transmitted through the etalon element to detect an optical power value of the input light, wherein the first transmission characteristic in the etalon element is obtained by normalizing the first monitor value by the optical power value of the input light, and the second transmission characteristic in the etalon element is obtained by normalizing the second monitor value by the optical power value of the input light.

5. The wavelength monitoring device according to claim 3, further comprising another light receiving device that receives the input light that has not been transmitted through the etalon element to detect an optical power value of the input light, wherein the first transmission characteristic in the etalon element is obtained by normalizing the first monitor value by the optical power value of the input light, and the second transmission characteristic in the etalon element is obtained by normalizing the second monitor value by the optical power value of the input light.

6. A light source device comprising:

a laser that can change a wavelength of light to be output;

a wavelength monitoring device according to claim 1 that monitors a wavelength of a laser beam output from the laser; and a control unit that performs, based on a monitoring result obtained by the wavelength monitoring device, wavelength control in which a wavelength of the laser beam is adjusted to a predetermined target wavelength.

7. An optical module that includes a light source device according to claim 6.

8. A wavelength monitoring device comprising:

a polarization switching element that switches a polarization direction of input light;

an etalon element that includes a first double refractive layer and a single refractive layer or a second double refractive layer that is disposed by rotating an optic axis of the second double refractive layer by 90° with respect to an optic axis of the first double refractive layer; and a light receiving device that receives the input light, which has the polarization direction switched to a direction parallel to the optic axis of the first double refractive layer by the polarization switching element and is transmitted through the etalon element, to detect a first monitor value used to monitor a wavelength of the input light, and that receives the input light, which has the polarization direction switched to a direction perpendicular to the optic axis of the first double refractive layer by the polarization switching element and is transmitted through the etalon element, to detect a second monitor value used to monitor the wavelength of the input light.

9. The wavelength monitoring device according to claim 8, wherein the etalon element has a first transmission characteristic that is associated with a direction parallel to the optic axis of the first double refractive layer and in which the first monitor value is periodically changed with respect to the wavelength of the input light and a second transmission characteristic that is associated with a direction perpendicular to the optic axis of the first double refractive layer and in which the second monitor value is periodically changed with respect to the wavelength of the input light, a thickness of the first double refractive layer is set to a thickness, from among a plurality of types of thickness in a case where a phase difference between the first transmission characteristic and the second transmission characteristic in the etalon element is $(\pi/2+2k\pi)$ (where, k is an integer), associated with k that is equal to or less than a predetermined value, and a sum of the thickness of the first double refractive layer and the thickness of the single refractive layer is set such that a period of the first transmission characteristic and a period of the second transmission characteristic that are inversely proportional to the sum become equal to or less than a target period.

10. The wavelength monitoring device according to claim 8, wherein the etalon element has a first transmission characteristic that is associated with a direction parallel to the optic axis of the first double refractive layer and in which the first monitor value is periodically changed with respect to the wavelength of the input light and a second transmission characteristic that is associated with a direction perpendicular to the optic axis of the first double refractive layer and in which the second monitor value is periodically changed with respect to the wavelength of the input light, a difference between a thickness of the first double refractive layer and a thickness of the second double refractive layer is set to a thickness, from among a plurality of types of thickness in a case where a phase difference between the first transmission characteristic and the second transmission characteristic in the etalon element is $(\pi/2+2k)$ (where, k is an integer), associated with k that is equal to or less than a predetermined value, and a sum of the thickness of the first double refractive layer and the thickness of the second double refractive layer is set such that a period of the first transmission characteristic and a period of the second transmission characteristic that are inversely proportional to the sum become equal to or less than a target period.

11. The wavelength monitoring device according to claim 9, further comprising another light receiving device that receives the input light that has not been transmitted through the etalon element to detect an optical power value of the input light, wherein the first transmission characteristic in the etalon element is obtained by normalizing the first monitor value by the optical power value of the input light, and the second transmission characteristic in the etalon element is obtained by normalizing the second monitor value by the optical power value of the input light.

12. The wavelength monitoring device according to claim 10, further comprising another light receiving device that receives the input light that has not been transmitted through the etalon element to detect an optical power value of the input light, wherein the first transmission characteristic in the etalon element is obtained by normalizing the first monitor value by the optical power value of the input light, and the second transmission characteristic in the etalon element is obtained by normalizing the second monitor value by the optical power value of the input light.

13. A light source device comprising:

a laser that can change a wavelength of light to be output;

a wavelength monitoring device according to claim 8 that monitors a wavelength of a laser beam output from the laser; and a control unit that performs, based on a monitoring result obtained by the wavelength monitoring device, wavelength control in which a wavelength of the laser beam is adjusted to a predetermined target wavelength.

14. An optical module that includes a light source device according to claim 13.

* * * * *